United States Patent
Furuya

(10) Patent No.: US 7,678,687 B2
(45) Date of Patent: Mar. 16, 2010

(54) METHOD FOR MANUFACTURING SEMICONDUCTOR DEVICE AND SEMICONDUCTOR DEVICE

(75) Inventor: Akira Furuya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 775 days.

(21) Appl. No.: 11/496,399

(22) Filed: Aug. 1, 2006

(65) Prior Publication Data

US 2007/0037304 A1 Feb. 15, 2007

(30) Foreign Application Priority Data

Aug. 12, 2005 (JP) .............. 2005-234274

(51) Int. Cl.
*H01L 21/4763* (2006.01)
(52) U.S. Cl. .............. 438/627; 257/E21.252; 257/E21.584
(58) Field of Classification Search .......... 257/E21.252, 257/E21.584; 438/627, 706
See application file for complete search history.

(56) References Cited

U.S. PATENT DOCUMENTS

| 7,153,779 B2 * | 12/2006 | Trapp .................. 438/706 |
| 2003/0001282 A1 * | 1/2003 | Meynen et al. ............ 257/777 |
| 2007/0187359 A1 * | 8/2007 | Nakagawa et al. .......... 216/41 |

FOREIGN PATENT DOCUMENTS

| JP | 2000-294634 | 10/2000 |
| JP | 2004-193326 | 7/2004 |
| WO | WO 03/005438 | 1/2003 |

OTHER PUBLICATIONS

K. Maex et al., "Low dielectric constant materials for microelectronics" Journal of Applied Physics, vol. 93, No. 11, Jun. 1, 2003.
K. Omote et al. "Small angle x-ray scattering for measuring pore-size distributions in porous low-k films" vol. 82, No. 4, Jan. 27, 2003.

* cited by examiner

*Primary Examiner*—Asok K Sarkar
(74) *Attorney, Agent, or Firm*—Young & Thompson

(57) ABSTRACT

In a method for manufacturing a semiconductor device, insulation resistance of the porous film is stabilized, and leakage current between adjacent interconnects provides an improved reliability in signal propagation therethrough. The method includes: sequentially forming over a semiconductor substrate a porous film and a patterned resist film; forming a concave exposed surface of the substrate; forming a non-porous film covering the interior wall of the concave portion and the porous film; selectively removing the non-porous film from the bottom of the concave portion and the non-porous film by anisotropic etch; forming a barrier metal film covering the porous film and the interior wall; and forming a metallic film on the barrier metal film to fill the concave portion. The anisotropic etch process uses an etching gas with mixing ratio MR, $45 \leq MR \leq 100$, where MR=((gaseous "nitrogen" containing compound)+(inert gas))/(gaseous "fluorine" containing compound).

10 Claims, 9 Drawing Sheets

METHOD FOR MANUFACTURING SEMICONDUCTOR DEVICE AND SEMICONDUCTOR DEVICE

This application is based on Japanese patent application No. 2005-234,274, the content of which is incorporated hereinto by reference.

BACKGROUND

1. Technical Field

The present invention relates to a method for manufacturing a semiconductor device having a non-porous film formed between a porous film and a barrier metal film, and relates to the semiconductor device.

2. Related Art

In semiconductor devices of recent years, device operation speed is limited by a delay in signal propagation through interconnects. A delay constant through an interconnect is represented by a product of an interconnect resistance and an interconnect capacitance. Therefore, copper (Cu), which has lower electrical resistivity, is employed for interconnects, and a porous material, which has lower relative dielectric constant than the conventional $SiO_2$, is employed for an insulating interlayer formed between the interconnect layers, so that the operating speed of the device is increased.

A Cu multilayered interconnect is to be formed by manufacturing interconnects and vias by a damascene process. More specifically, first of all, an insulating film such as insulating interlayer and the like is formed on a semiconductor substrate. Then, an interconnect trench or a via hole (hereinafter referred to as a concave portion) is formed in the insulating film. Then, a barrier metal film is formed so as to cover an interior wall of the concave portion and further to cover the surface of the insulating film. Further, a Cu thin film serving as a seed layer is formed on the barrier metal film. Then, an electrolytic plating process is conducted by utilizing the Cu thin film as a cathode electrode to form a Cu film on the barrier metal film, so that the interior of the concave portion is filled therewith. Then, portions of the barrier metal film and the Cu film located in the outside of the concave portion are removed by a chemical mechanical polishing (CMP). By employing such method, the barrier metal film and the seed Cu film are partially remained only in the concave portion to form the interconnect or the via. In the above-described operation, the barrier metal film is provided between Cu and the insulating interlayer, for the purpose of preventing a diffusion of Cu into the semiconductor substrate, serving as an adhesion layer between the insulating interlayer and Cu, and further preventing an oxidization of Cu.

As described above, the interlayer insulating film is formed of a porous material having a relative dielectric constant, which is lower than that of conventionally employed $SiO_2$. Therefore, when the barrier metal film or the Cu film is formed, materials composing these films may often be penetrated into an interior of a pore of the porous film (interlayer insulating film). In recent years, in order to improve a coating-ability of the barrier metal thin film, a deposition thereof by an atomic layer deposition (ALD) process is examined.

Nonetheless, the barrier metal easily penetrates into the pores of the porous film, since the ALD process generally provides higher step coverage. This phenomenon reduces the film thickness of the barrier metal film formed in the concave portion, and thus ability for preventing a diffusion of Cu into the insulating layer through the barrier metal film is reduced. Therefore, a reliability of transistor characteristics in the semiconductor device is reduced. Further, insulating properties such as a dielectric breakdown voltage are degraded by metals such as barrier metal or Cu penetrating in the interior of the pores in the porous film. Further, a leakage current—is increased between adjacent interconnects, thereby reducing a reliability in a signal propagation through the interconnect.

In such circumstances, a type of semiconductor device, which is capable of preventing the barrier metal formed by the ALD process from entering in the interior of pores of the porous film and thus preventing a reduction in the thickness of the barrier metal film, is expected.

Typical implementations of such semiconductor device shown in FIG. 8 are described in Japanese Patent Laid-Open No. 2000-294,634, Japanese Patent Domestic Publication No. 2004-535,065 for PCT International Application and K. Maex, M. R. Baklanov, D. Shamiryan, F. Iacopi, S. H. Brongersma and Z. S. Yanovitskaya, Journal of Applied Physics 93 (11), pp. 8793-8841, 2003. A semiconductor device shown in FIG. 8 contains a semiconductor substrate 112 containing a semiconductor element, a via layer 132 formed over the semiconductor substrate 112 and Cu interconnect layer formed over the via layer 132. The via layer 132 shown in FIG. 9 is composed of an etching stopper 114, a porous film 116 and a protective film 118 stacked in this sequence. A concave portion is formed in the via layer 132, so as to expose a surface of Cu interconnect of the semiconductor substrate 112 in a bottom thereof. Furthermore, a viaplug 120 is formed in the concave portion. The viaplug 120 is composed of a non-porous film 124, a barrier metal film 128 and a Cu film 130. A non-porous film 124 that covers a side wall of the concave portion, a barrier metal film 128 that covers surfaces of the non-porous film 124 and a surface of Cu interconnect of the semiconductor substrate 112 exposed on the bottom of the concave portion, and a Cu film 130 that plugs the interior of the concave portion are formed in this concave portion. An interconnect layer 133 is formed on the via layer 132. A multilayered insulating film 134 contains the via layer 132 and the interconnect layer 133.

As a material for serving as the non-porous film 124, $SiO_2$ is illustrated in Japanese Patent Laid-Open No. 2000-294, 634, $Si_xC_y$: $H_z$ is illustrated in Japanese Patent Domestic Publication No. 2004-535,065 for PCT International Application, and $SiO_2$, SiC and SiN are illustrated in K. Maex, M. R. Baklanov, D. Shamiryan, F. Iacopi, S. H. Brongersma and Z. S. Yanovitskaya, Journal of Applied Physics 93 (11), pp. 8793-8841, 2003.

Further, a semiconductor device having a configuration, in which an insulating film fills an inside of a pore of a porous film exposed to an interior of a concave portion, is described in Japanese Patent Laid-Open No. 2004-193,326. It is described in Japanese Patent Laid-Open No. 2004-193,326 that non-porous polyallylether or $SiO_x$ $(CH_3)_y$ is employed for forming such insulating film.

Nonetheless, there is a room for an improvement in the conventional technologies described above in terms of the following issues. In the processes described in Japanese Patent Laid-Open No. 2000-294,634, Japanese Patent Domestic Publication No. 2004-535,065 for PCT International Application and the above-described K. Maex et al., barrier metal or Cu is introduced in the interior of the pores in the porous film to reduce the insulation resistance of the porous film and to further cause a leakage current between adjacent interconnects, so that the reliability in the signal propagation through interconnects may be reduced. In particular, such tendency is considerable when the barrier metal film is formed by an ALD process.

In the process described in Japanese Patent Laid-Open No. 2004-193,326, the interior of the pores existing in the porous film exposed to the concave portion can not be fully filled with the insulating film, and therefore there is also a room for an improvement in such process, similarly in the technologies described above. Further, in the process described in Japanese Patent Laid-Open No. 2004-193,326, it is necessary to remove an unnecessary portion of the insulating film on the surface of the porous film after the operation of filling the inside of pores of the porous film, and therefore there is a fear that the process becomes complicated.

SUMMARY OF THE INVENTION

According to one aspect of the present invention, there is provided a method for manufacturing a semiconductor device, comprising: forming a porous film over a semiconductor substrate; forming a resist film having a predetermined pattern over the porous film; forming a concave portion exposed surface of said semiconductor substrate containing a semiconductor element to that bottom, by etching said porous film through a mask of said resist film; forming a non-porous film so as to cover whole of the interior wall of the concave portion and the surface of the porous film; selectively removing a portion of the non-porous film formed on the bottom of the concave portion and a portion of the non-porous film located on the porous film by an anisotropic etch process; forming a barrier metal film so as to cover the porous film and the interior wall of the concave portion having the non-porous film on the side wall thereof; and forming a metallic film on the barrier metal film to fill the concave portion and then partially removing portions of the barrier metal film and the metallic film that are outside of the concave portion, thereby partially leaving the barrier metal film and the metallic film only in the concave portion, wherein, in the selectively removing the non-porous film, the anisotropic etch process is conducted by employing an etching gas having a mixing ratio within a range of equal to or more than 45 and equal to or less than 100, the mixing ratio being represented by a formula:

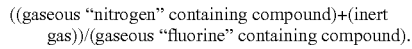

((gaseous "nitrogen" containing compound)+(inert gas))/(gaseous "fluorine" containing compound).

According to the above-described aspect of the present invention, the portion of the non-porous film located in the bottom of the concave portion of the porous film is removed by an anisotropic etch process under a predetermined condition, so that penetrations of barrier metal and/or Cu into the pores in the porous film are avoided, leading to providing a stabilized insulation resistance of the porous film. Further, the configuration also provides a prevention from a leakage current caused between adjacent interconnects, thereby providing an improved reliability in signal propagation through the interconnect. Further, the advantageous effects described above can be easily obtained by just conducting an anisotropic etch process under a predetermined condition, so that a simple process for manufacturing the semiconductor device can be presented.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

Figure 1A:
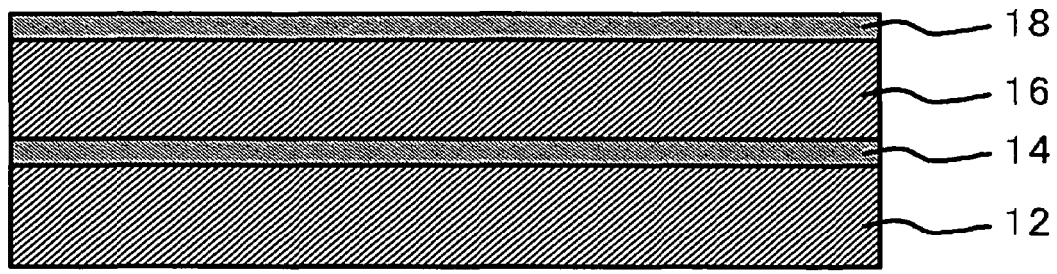
FIGS. 1A to 1C are cross-sectional views of a semiconductor device, schematically illustrating a method for manufacturing the semiconductor device according to an embodiment.

FIGS. 1A to 1C, FIGS. 2A to 2C and FIGS. 3A and 3B show cross-sectional views of a semiconductor device, illustrating a process for manufacturing the semiconductor device according to the present embodiment. As shown in FIG. 1A, first of all, an etching stopper 14, a porous film 16 and a protective film 18 for protecting the porous film 16 are sequentially deposited on the semiconductor substrate 12. The semiconductor substrate 12 contains a semiconductor element (not shown in the figure).

The etching stopper 14 is formed of a SiOC film or the like, and may have a thickness within a range of from about 25 nm to 150 nm. The porous film 16 is formed of a thin film of methyl silsesquioxane (MSQ), and formed by an ordinary spin coating process. Film thickness of the porous film 16 may be designed to be within a range of from 50 nm to about 1,000 nm. The protective film 18 is formed of SiO$_2$ film or the like, and may have a thickness within a range of from 25 nm to 150 nm.

The porous film 16 may have a porosity of within a range of equal to or more than 10% and equal to or less than 60%, and may further have a mean pore diameter of within a range of equal to or more than 0.1 nm and equal to or less than 5 nm. Such porous film 16 is employed to provide a prevention from a leakage current caused between adjacent interconnects, thereby providing an improved reliability in signal propagation through the interconnect.

The porosity and the mean pore diameter may be determined by analyzing results of X-ray diffuse scattering measurements by an analyzing software "Nano-Solver", commercially available from Rigaku Corporation, Tokyo Japan. In addition to above, an operation principle of the software is described in, for example, Omote, K., Y. Ito and S. Kawamura: "Small Angle X-Ray Scattering for Measuring Pore-Size Distribution in Porous Low-k Films", Appl. Phys. Lett., 82, pp. 544-546, (2003).

Figure 1B:
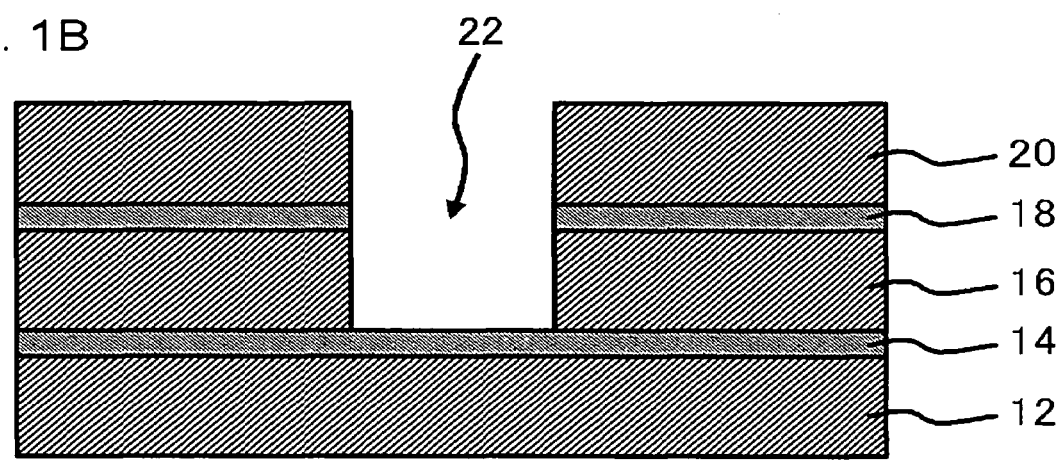

Then, a resist film 20 having a pattern of interconnect trenches (or via holes) formed thereon is formed on the protective film 18 by an ordinary patterning process. Further, the protective film 18 and the porous film 16 are etched by an ordinary etch process through a mask of the resist film 20, and the etch is spontaneously stopped at the surface of the etching stopper 14. This procedure provides a formation of the concave portion 22 having the bottom surface, which is equivalent to the surface of the etching stopper 14 (FIG. 1B).

Figure 1C:
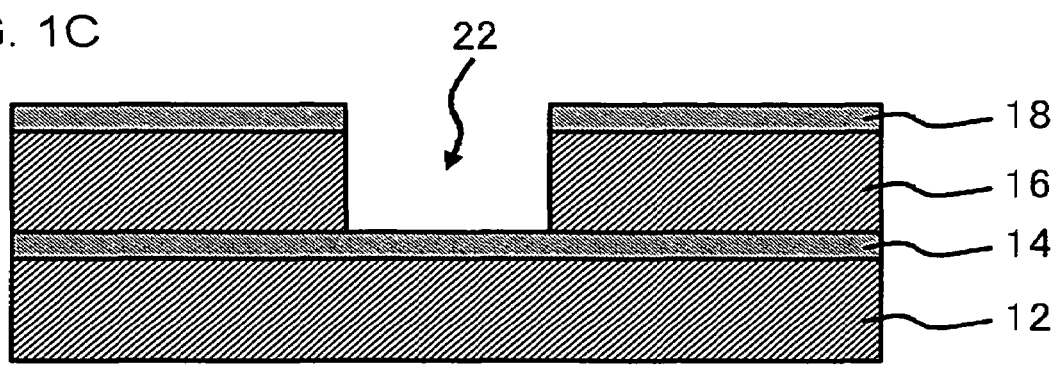
Figure 2A:
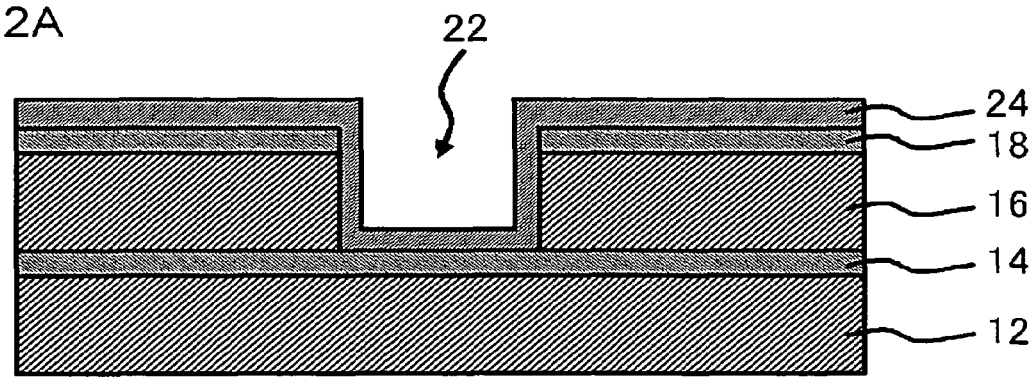
FIG. 2A to 2C are cross-sectional views of a semiconductor device, schematically illustrating a method for manufacturing the semiconductor device according to an embodiment.

After forming the concave portion 22, the resist film 20 is removed by an ashing process (FIG. 1C). Then, a non-porous film 24 is formed so as to cover an interior wall of the concave portion 22 and the entire surface of the protective film 18 on the porous film 16 (FIG. 2A). The non-porous film 24 functions as a sealing film that provides a blockage of pores located on the surface of the porous film 16. The non-porous film 24 is formed of a SiCH film or the like, and may have a thickness within a range of from about 1 nm to 10 nm. The non-porous film 24 may be formed by a plasma-enhanced chemical vapor deposition (PECVD) employing a source material of tetramethylsilane.

More specifically, the thickness of the side wall formed on the wall in the side of the concave portion 22 may be preferably reduced as much as possible in view of increasing an operation speed of the semiconductor device, so that the cross sectional area of the interconnect trench or the via hole is increased, thereby reducing the resistance thereof. On the other hand, since a thermal shrinkage is occurred at higher temperature in the porous film 16 composed of the MSQ thin film, there is an upper limit in the temperature range available for forming the non-porous film 24. It is necessary to select the temperature as within a range of equal to or lower than 500 degree C. for forming the non-porous film 24, though the temperature range depends on the manufacturing process and/or the material for the film. According to above-described reasons, a PECVD process utilizing plasma, which can achieve higher coverage and can be operable at a lower deposition temperature, is employed for the process for manufacturing the non-porous film 24.

Figure 2B:
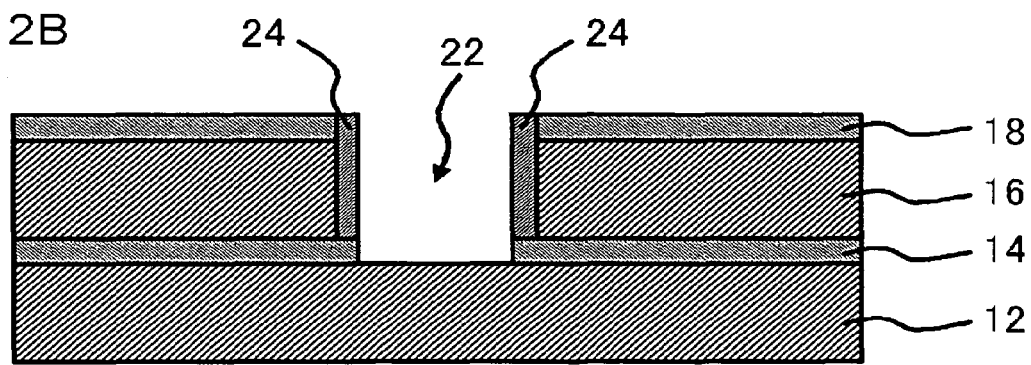

Then, by an anisotropic etch process, portions of the etching stopper 14 and the non-porous film 24 stacking on the bottom of the concave portion 22 and portions of the non-porous film 24 formed on the surface of the protective film 18 on the porous film 16 are selectively removed (FIG. 2B). A surface of a Cu interconnect (no shown in the figure) of the semiconductor substrate 12 is exposed in a bottom of the concave portion 22.

The anisotropic etch process is conducted by a plasma etch process. In the plasma etch process, an etching gas having a mixing ratio within a range of equal to or more than 45 and equal to or less than 100, which is represented by a formula:

((gaseous "nitrogen" containing compound)+(inert gas))/(gaseous "fluorine" containing compound), can be employed.

Such etcthing gas having the above-described mixing ratio is employed to provide a stabilized insulation resistance of the porous film and a prevention from a leakage current caused between adjacent interconnects, thereby providing an improved reliability in signal propagation through the interconnect.

In such etcthing gas, typical gaseous "nitrogen" containing compound may be nitrogen ($N_2$) gas or the like. Typical inert gas may be argon (Ar) gas or the like. Typical gaseous "fluorine" containing compound may be a gaseous chemical compound such as $CF_4$, $C_4F_6$, $CH_2F_2$, $SF_6$, HFC or the like.

Among these various types of gaseous compounds, $N_2$ gas may be preferably employed for the gaseous "nitrogen" containing compound, Ar gas may be preferably employed for the inert gas, and $CF_4$ may be preferably employed for the gaseous "fluorine" containing compound, so that further improvement can be provided in the above-described advantageous effects.

Further, the plasma etch process may be conducted under a condition of a vacuum level within a range of equal to or higher than 1 mTorr and lower than 10 mTorr. This further stabilizes the insulation resistance of the porous film, and a leakage current caused between adjacent interconnects is avoided, thereby providing a further improved reliability in signal propagation through the interconnect. It is considered that the above-described advantageous effect can be obtained since linearity of various types of gaseous compounds are increased when they are in plasma state, and thus methyl group existing in the surface of the non-porous film 24 exposed in the concave portion 22 is preferentially removed, as compared with methyl group existing in the surface of the non-porous film 25 formed in the pore 16a of the porous film 16.

Figure 2C:
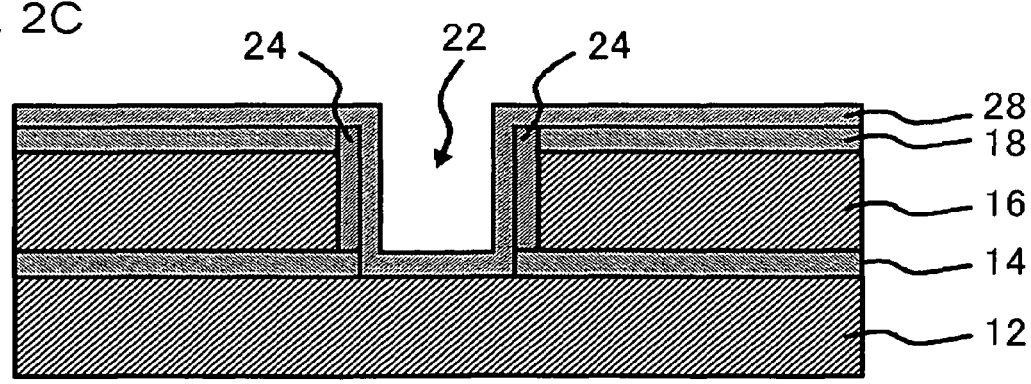

After conducting the anisotropic etch process, a barrier metal film 28 is formed so as to cover the entire interior wall of the concave portion 22 having the non-porous film 24 on the side wall thereof and the porous film 16 (FIG. 2C).

The barrier metal film 28 may be formed by an ALD process. Typical barrier metal film 28 may include a tantalum nitride (TaN) film, a tantalum (Ta) film, a titanium nitride (TiN) film or the like, and may be formed to have a thickness within a range of from about 1 nm to 5 nm.

Figure 3A:
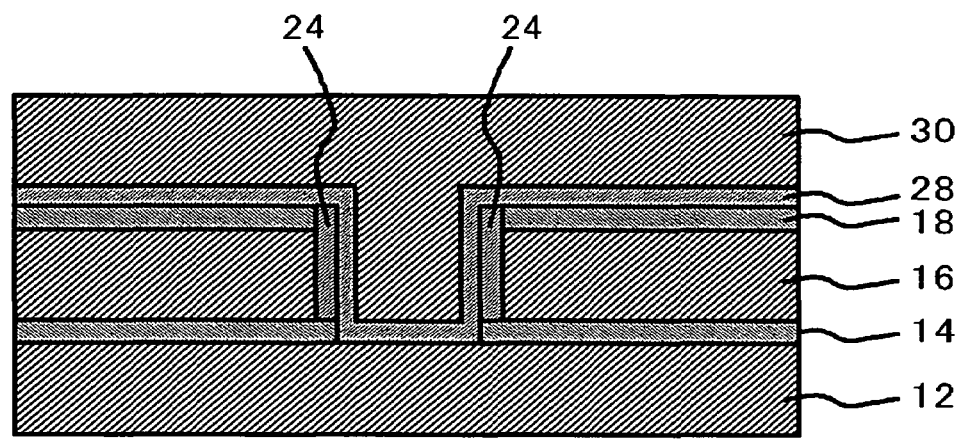
FIGS. 3A and 3B are cross-sectional views of a semiconductor device, schematically illustrating a method for manufacturing the semiconductor device according to an embodiment.

Then, a copper (Cu) film (metallic film) 30 is formed on the barrier metal film 28 to fill the concave portion 22 (FIG. 3A). More specifically, the Cu film 30 is formed by an electrolytic plating process by utilizing a seed metallic layer (not shown) as a cathode electrode.

Figure 3B:
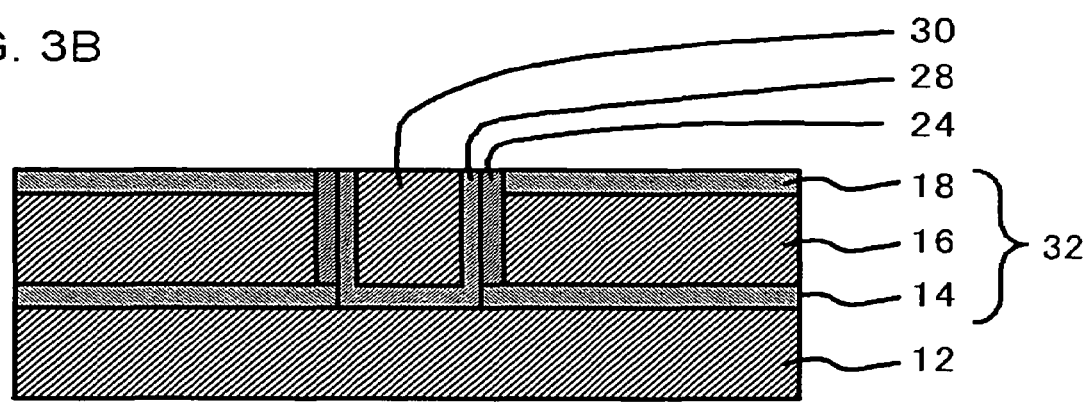

Then, portions of the barrier metal film 28 and the Cu film 30 disposed outside of the concave portion 22 are removed by an ordinary CMP process, so that the barrier metal film 28 and the Cu film 30 are remained only in the concave portion 22, thereby forming a Cu interconnect (or via plug) in the concave portion 22 (FIG. 3B). This provides the semiconductor device having the via layer 32 formed on the semiconductor substrate 12. Further, a predetermined process is conducted to manufacture a multilayered interconnect structure on the via layer 32, completing the semiconductor device according to the present embodiment.

Advantageous effects obtainable by employing the configuration according to the present embodiment will be described as follows. According to the method for manufacturing the semiconductor device of the present embodiment, introduction of the materials composing the barrier metal film or the Cu film into the interior of pores of the porous film is avoided. Therefore, the semiconductor device exhibiting a stable insulation resistance of the porous film can be provided. Further, a leakage current caused between adjacent interconnects is avoided, so that the semiconductor device exhibiting an improved reliability in signal propagation through the interconnect can be provided.

Reason for obtaining such advantageous effects will be described as follows, in reference to the figures. In the method for manufacturing the semiconductor device according to the present embodiment, the non-porous film 24 is formed by the PECVD process as described above. If the pore 16a is formed in the surface of the porous film 16 so to expose the interior of the pore in the PECVD process, it may be a case that the deposited non-porous film 24 is not capable of sufficiently filling the pore 16a, remaining the exposed pores.

Figure 4A:
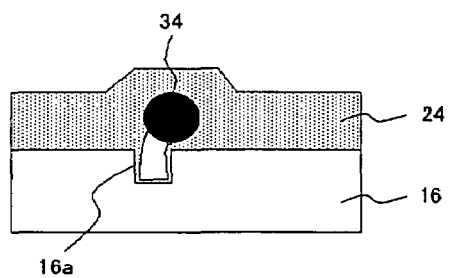
FIGS. 4A to 4C are cross-sectional views of a semiconductor device, useful in describing a configuration that an aperture of a pore is created in a surface of a porous film in a process for forming a non-porous film by a PECVD process.

More specifically, according to the scientific knowledge of the present inventors, the mechanism thereof is as follows. Fine particles are generated as reaction byproducts in the process for forming the non-porous film 24 by the PECVD process. When the film thickness of the non-porous film 24 formed on the surface of the porous film 16 is sufficiently thick as shown in FIG. 4A, an influence of the generated fine particle 34 is smaller, and thus the pore 16a is sufficiently covered therewith.

Figure 4B:
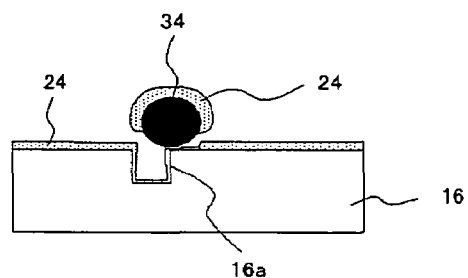
Figure 4C:
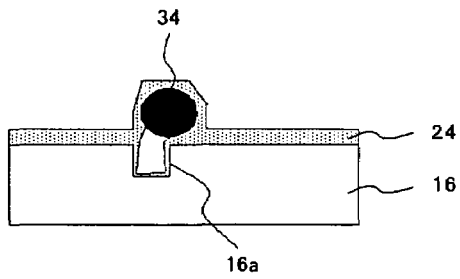
Figure 4C:
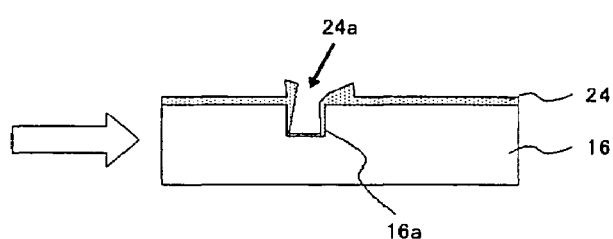

However, since the non-porous film 24 formed by the PECVD process is a thin film having a thickness within a range of from about 1 nm to 10 nm, the non-porous film may often provides an insufficient coverage to the pore 16a, as shown in FIG. 4B. Further, after the coverage of the pore 16a with the non-porous film 24 is once completed, the removal of the fine particle 34 from the non-porous film 24 in the later process creates a pinhole 24a in the non-porous film 24, thereby exposing the pore 16a again, as shown in FIG. 4C. A number of pinholes 24a are formed in the non-porous film 24, when diameter of the fine particle 34 is about several nanometers, and the film thickness of the non-porous film 24 is equal to or less than 10 nm.

When the barrier metal film 28 is deposited by an ALD process on the non-porous film 24 in such condition, metallic gases diffuse into the interior of the pore 16a through the pinhole 24a to deposit a metallic film in the pore 16a. Such deposition of the metallic film in the inside of the pore 16a reduces a dielectric breakdown voltage though only a smaller amount of the metallic film is formed, and further a leakage current or the like is caused between the adjacent interconnects, so that there is a possibility of reducing reliability in the signal propagation through the interconnect.

Figure 5:
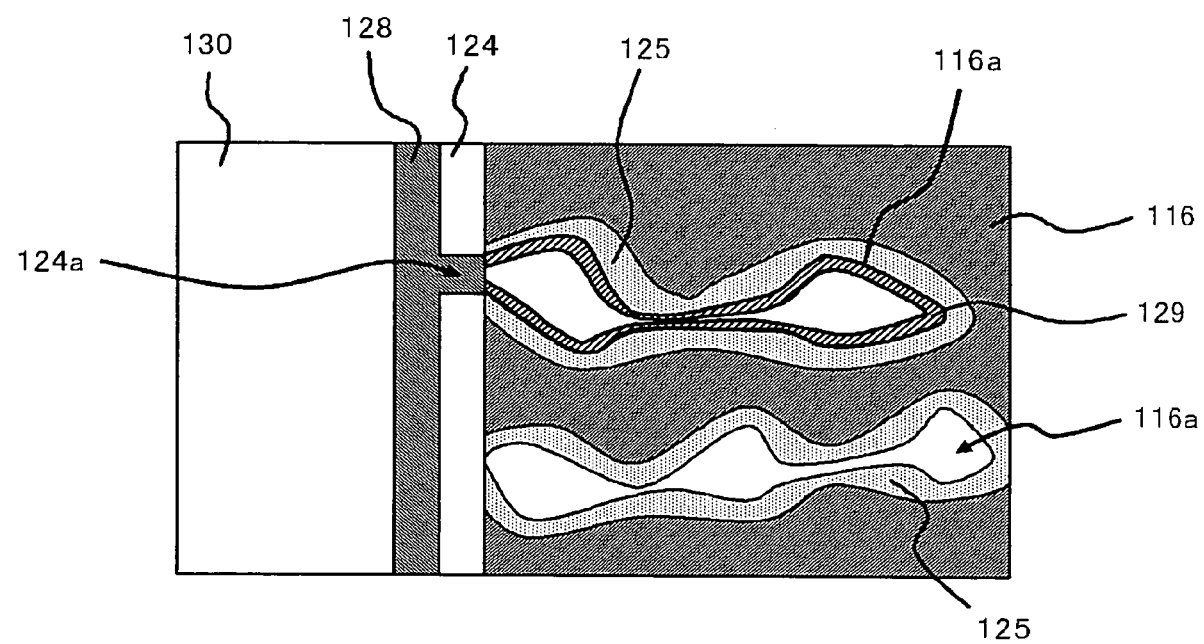
FIG. 5 is a schematic partially enlarged view of the porous film in a conventional semiconductor device.

In the method for manufacturing the semiconductor device described in Japanese Patent Laid-Open No. 2000-294,634, a configuration is described, in which a non-porous film is formed by a PECVD process, and further a barrier metal film is deposited by an ALD process. However, as shown in FIG. 5, in the above-described conventional process, a metallic gas diffuses in the inside of the pore 116a through the pinhole 124a of the non-porous film 124 to form a metallic film 129 on an interior wall of the non-porous film 125 formed in the pore 116a. Thus, in the conventional configuration, a dielectric breakdown voltage is decreased and further a leakage current or the like is caused between the adjacent interconnects, thereby causing a reduced reliability in the signal propagation through the interconnect.

Figure 6:
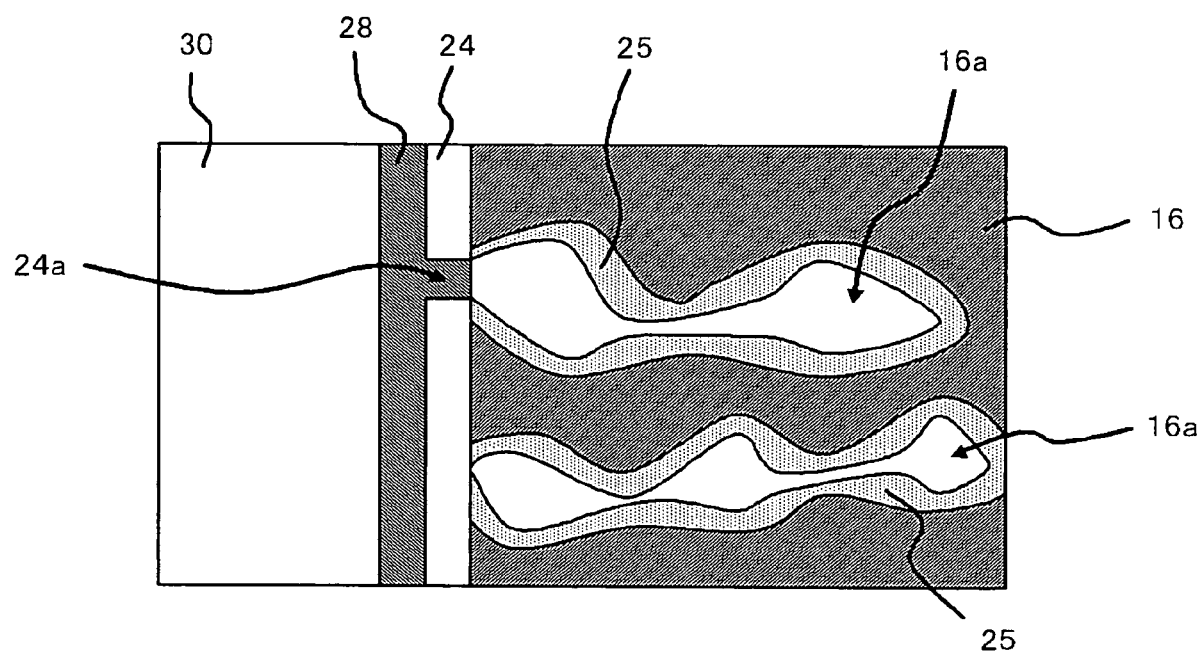
FIG. 6 is a schematic partially enlarged view of the porous film in the semiconductor device of the embodiment according to the present invention.

On the contrary, according to the method for manufacturing the semiconductor device of the present embodiment, as shown in FIG. 6, no metallic film is formed on the interior wall of the non-porous film 25 formed in the pore 16a, even though the pinhole 24a is formed in the non-porous film 24.

It is estimated that the reason for obtaining such advantageous effect may be that density of methyl group in the surface of the non-porous film 24 exposed in the concave portion 22 is provided to be lower than density of methyl group in the surface of the non-porous film 25 covering an interior wall of the pore 16a in the porous film 16, by suitably selecting a predetermined condition for removing the etching stopper 14 in the plasma etching process.

Such phenomenon will be described by presenting results of experiments as follows. Two substrates were prepared, and non-porous films having a thickness of about 5 nm were formed on these surfaces to provide a solid film. The non-porous film was formed by a PECVD process employing tetramethylsilane as a source material. Then, a plasma etch process was conducted over one of the non-porous films under a condition of an etcthing gas mixing ratio: $(N_2+Ar)/CF_4=70$; and a vacuum level of 5 mTorr. Density of methyl group in the surface of the non-porous film was measured by a Fourier transform infrared (FTIR) spectroscopy. Provided that density in the non-porous film, which had not been plasma etched, was defined as 100%, density of methyl group in the surface of the non-porous film, which had been plasma etched, was around 75%.

The two substrate having non-porous films formed thereon were employed, and barrier metal films (TaN films) were deposited on the surfaces of these non-porous film by an ALD process. In the deposition process for the barrier metal film by the ALD process, a series of introductions of source materials were repeated to deposit atomic layers or molecular layers. In general, a series of processes of: a supply of a source material including a metal; a purging; a supply of a reducing source material; and another purging are conducted as a unit of a cycle. A relationship of the deposition process cycle in the ALD process and the film thickness of the deposited barrier metal is shown in FIG. 7.

Figure 7:
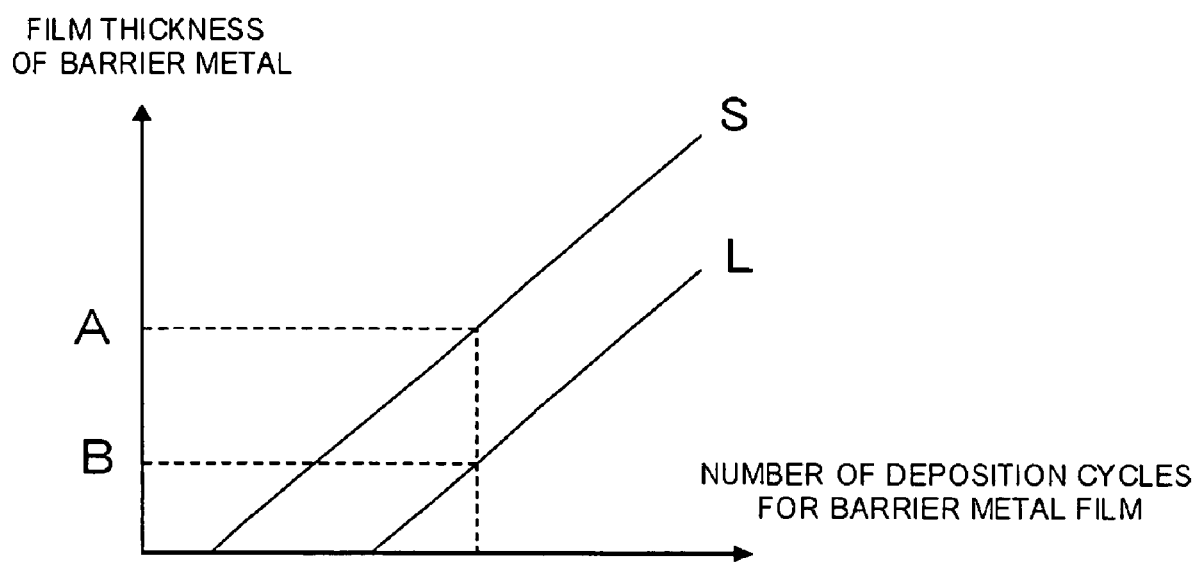
FIG. 7 is a graph, showing a relationship between film thickness of the barrier metal film and the deposition cycle in an ALD process.

As shown in FIG. 7, for an unprocessed non-porous film (indicated by "S"), the film thickness of the barrier metal film formed on the surface thereof was increased in proportion to number of cycles for depositing the barrier metal film. On the other hand, for a non-porous film treated by a plasma etch (indicated by "L"), substantially no film was deposited until a certain number of deposition cycles were conducted, and thereafter, the depositions were achieved to form the layers with a similar ratio thereof as in the case of the unprocessed non-porous film. Although such non-deposition cycle also exists in the process of depositing the barrier metal film on the unprocessed non-porous film (S), the incubation cycle in this case is shorter than the case of depositing on the non-porous film treated by a plasma etch (L), as can be seen from FIG. 7.

More specifically, if there is such difference in the incubation cycle between the processed/unprocessed non-porous films, before the barrier metal film is formed on the surface of the non-porous film 25 formed in the inside of the pore 16a of the porous film 16, the barrier metal film 28 is formed on the surface of the non-porous film 24 exposed in the concave portion 22. It is considered that the opening of the pore 16a is blockaded for these reasons, and therefore substantially no barrier metal is deposited in the interior of the pore 16a.

Such difference in the incubation cycle between the processed/unprocessed non-porous films may suitably depend on the size of the pinhole formed in the non-porous film or types of the employed non-porous film. Nonetheless, the investigation of present inventors have found that, provided that a desired film thickness of the barrier metal is defined as A, and if there is a difference in the incubation cycle between the depositions on the unprocessed/processed films for achieving the film thickness B, which is equal to or less than 80% of the desired thickness A as shown in FIG. 7, problems such as increasing the leakage current between adjacent interconnects and the like are not caused.

As such, if an appropriate difference is caused in the incubation cycle between the processes for depositing barrier metal films on the surface of the non-porous film 24 exposed in the concave portion 22 and on the surface of the non-porous film 25 formed in the interior of the pore 16a in the porous film 16, an etching gas having a mixing ratio within a range of equal to or more than 45 and equal to or less than 100, and preferably within a range of from equal to or more than 60 and equal to or less than 80, may be employed during the plasma etch process, the mixing ratio being represented by a formula:

((gaseous "nitrogen" containing compound)+(inert gas))/(gaseous "fluorine" containing compound).

Generally, a typical plasma etch process for the etching stopper is conducted by employing a gaseous etchant mixture of $CF_4$, $N_2$ and Ar with a mixing ratio of: $(N_2+Ar)/CF_4$=about 1 to 40. However, the gaseous etchant mixture of such mixing ratio provides insufficient difference in the incubation cycle, leading to an unwanted deposition of the barrier metal film in the interior of the pore. Therefore, a leakage current may be generated between the adjacent interconnects.

On the contrary, by employing the etcthing gas of the mixing ratio according to the present embodiment, methyl group contained in the surface of the non-porous film 24 exposed in the concave portion 22 can be selectively removed. Therefore, a leakage current or the like is not caused between the adjacent interconnects, thereby providing an improved reliability in the signal propagation through the interconnect.

Further, the plasma etch process may be conducted at a vacuum level within a range of equal to or more than 1 mTorr and equal to or less than 10 mTorr, and preferably at a vacuum level within a range of equal to or more than 3 mTorr and equal to or less than 8 mTorr.

Generally, the plasma etch process for the etching stopper is typically conducted at a vacuum level within a range of from 10 mTorr to 100 mTorr. However, such vacuum level provides insufficient difference in the incubation cycle, leading to an unwanted deposition of the barrier metal film in the interior of the pore 16a. Therefore, a leakage current may be generated between the adjacent interconnects.

On the contrary, by conducting the plasma etch process at a vacuum level described in the present embodiment, linearity of various types of gases in the plasma state are increased, so that methyl group contained in the surface of the non-porous film 24 exposed in the concave portion 22 can be selectively removed. This procedure provides a difference in the incubation cycle between the deposition on the surface of the non-porous film 24 exposed in the concave portion 22 and the deposition on the surface of the non-porous film 25 formed in the interior of the pore 16a in the porous film 16.

While the preferred embodiments of the present invention have been described above in reference to the annexed figures, it should be understood that the disclosures above are presented for the purpose of illustrating the present invention, and various configurations other than the above described configurations can also be adopted.

For example, the porous film 16 may be formed by a CVD process, in addition to the spin coating process.

Further, while the exemplary implementation of forming the etching stopper 14 and the protective film 18 for protecting the porous film 16 has been described here, the configuration is not particularly limited thereto, and a configuration of depositing none of such films may also be employed.

Figure 8:
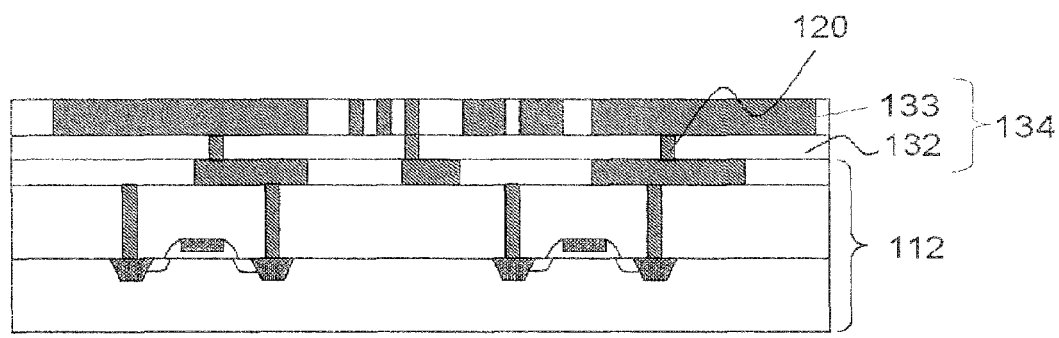
FIG. 8 is a cross-sectional view, schematically showing a conventional semiconductor device.
Figure 9:
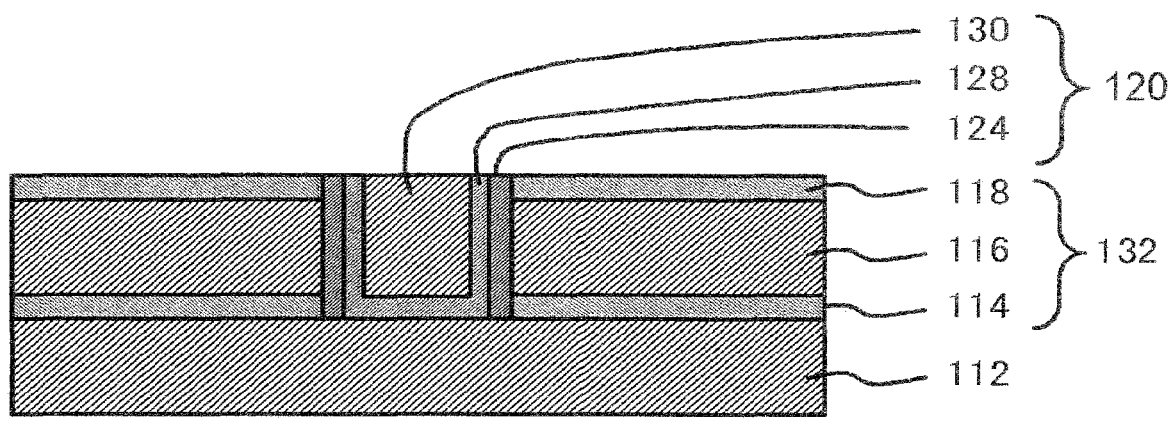
FIG. 9 is a cross-sectional view, schematically showing a semiconductor substrate 112 and a via layer 132 in a conventional semiconductor device.

Further, while the exemplary implementation of forming the via layer 32 by single damascene process, the via in the via layer 32 and the interconnect in the interconnect layer formed on the via layer 32 may be formed by dual damascene process to be structure shown FIG. 8.

EXAMPLES

Example 1

The semiconductor device is shown in FIG. 3B was manufactured according to the aforementioned process for manufacturing the semiconductor device so as to have the following constitution. In addition to above, a pair of Cu interconnects were formed to be mutually adjacent. Further, the plasma etch process for selectively removing the etching stopper 14 and the non-porous film 24 that are deposited in the bottom of the concave portion 22 and the non-porous film 24 formed on the surface of the protective film 18 on the porous film 16 was conducted under the following condition.

<Constitution>
  etching stopper 14: SiOC thin film, film thickness of about 100 nm;
  porous film 16: MSQ thin film, film thickness of about 500 nm, porosity of about 40%, mean pore diameter of about 3 nm;
  protective film 18: $SiO_2$ thin film, film thickness of about 100 nm;
  non-porous film 24: SiCH film, film thickness of about 5 nm; and
  barrier metal film 28: TaN film, film thickness of about 3 nm.

<Condition for Plasma Etch>
  plasma power: 700 W;
  bias power: 100 W;
  vacuum level: 1 mTorr, and
  etcthing gas (mixing ratio: $(N_2+Ar)/CF_4$=45): $N_2$ gas at a volumetric flow rate of 525 sccm, Ar gas at a volumetric flow rate of 1,500 sccm and $CF_4$ gas at a volumetric flow rate of 45 sccm.

In the obtained semiconductor device, a leakage current generated between the adjacent interconnects was measured. As a result, no leakage current was detected in the semiconductor device of example 1.

Example 2

The semiconductor device was manufactured under the same condition as employed in example 1, except that the etcthing gas was a mixture of: $N_2$ gas at a volumetric flow rate of 2,000 sccm; Ar gas at a volumetric flow rate of 2,500 sccm; and $CF_4$ gas at a volumetric flow rate of 45 sccm, and the mixing ratio of the etcthing gas: $(N_2+Ar)/CF_4$ was 100, and a leakage current generated in the resultant device was measured. As a result, no leakage current was detected in the semiconductor device of example 2.

Example 3

The semiconductor device was manufactured under the same condition as employed in example 1, except that the vacuum level during the plasma etch process was at 9 mTorr, and the a leakage current generated in the resultant device was measured. As a result, no leakage current was detected in the semiconductor device of example 3.

Comparative Example 1

The semiconductor device was manufactured under the same condition as employed in example 1, except that the etcthing gas was a mixture of: $N_2$ gas at a volumetric flow rate of 1,500 sccm; Ar gas at a volumetric flow rate of 1,500 sccm;

and $CF_4$ gas at a volumetric flow rate of 100 sccm, and the mixing ratio of the etcthing gas: $(N_2+Ar)/CF_4$ was 30, and a leakage current generated in the resultant device was measured. As a result, a leakage current was detected in the semiconductor device of comparative example 1.

Comparative Example 2

The semiconductor device was manufactured under the same condition as employed in example 1, except that the vacuum level during the plasma etch process was at 20 mTorr, and the a leakage current generated in the resultant device was measured. As a result, a leakage current was detected in the semiconductor device of comparative example 2.

As described above, it was confirmed that no leakage current was generated and the reliability in the signal propagation through the interconnect was improved, by employing an etcthing gas having a mixing ratio of within a range of equal to or more than 45 and equal to or less than 100 in the plasma etch process in the method for manufacturing the semiconductor device, the mixing ratio being represented by a formula:

((gaseous "nitrogen" containing compound)+(inert gas))/(gaseous "fluorine" containing compound).

Further, it was confirmed that the above-described advantageous effects could be obtained by conducting the plasma etch process with the etcthing gas having the above-described mixing ratio and at a vacuum level within a range of equal to or more than 1 mTorr and less than 10 mTorr.

It is apparent that the present invention is not limited to the above embodiment, that may be modified and changed without departing from the scope and spirit of the invention.

What is claimed is:

1. A method for manufacturing a semiconductor device, comprising:
   forming an etching stopper on a semiconductor substrate;
   forming a porous film over said semiconductor substrate and said etching stopper;
   forming a resist film having a predetermined pattern over said porous film;
   forming a concave portion with a bottom thereof being an exposed surface of said etching stopper by etching said porous film through a mask of said resist film;
   forming a nonporous film so as to cover a whole of an interior wall of said concave portion and the surface of said porous film;
   selectively removing a portion of said nonporous film formed on the bottom of said concave portion, a portion of said non-porous film located on said porous film and a portion of said etching stopper by an anisotropic etch process to expose said semiconductor substrate;
   forming a barrier metal film so as to cover said porous film and the interior wall of said concave portion having said non-porous film on the side wall thereof; and
   forming a metallic film on said barrier metal film to fill said concave portion and then partially removing portions of said barrier metal film and said metallic film that are outside of said concave portion, thereby partially leaving the barrier metal film and the metallic film only in said concave portion,
   wherein, in said selectively removing said non-porous film, the anisotropic etch process is conducted by employing an etching gas having a mixing ratio within a range of equal to or more than 45 and equal to or less than 100, said mixing ratio being represented by a formula:

((gaseous "nitrogen" containing compound)+(inert gas))/(gaseous "fluorine" containing compound).

2. The method for manufacturing the semiconductor device according to claim 1, wherein said gaseous "nitrogen" containing compound is $N_2$ gas.

3. The method for manufacturing the semiconductor device according to claim 1, wherein said inert gas is Ar gas.

4. The method for manufacturing the semiconductor device according to claim 1, wherein said gaseous "fluorine" containing compound is $CF_4$ gas.

5. The method for manufacturing the semiconductor device according to claim 1, wherein, in said selectively removing said nonporous film, the anisotropic etch is conducted under a condition where a degree of vacuum is within a range of equal to or more than 1 mTorr and less than 10 mTorr.

6. The method for manufacturing the semiconductor device according to claim 1, wherein said anisotropic etch process is a plasma etch process.

7. The method for manufacturing the semiconductor device according to claim 1, wherein said forming the nonporous film includes forming the nonporous film so as to cover whole of the interior wall of said concave portion and the surface of said porous film by a plasma-enhanced chemical vapor deposition (PECVD) process.

8. The method for manufacturing the semiconductor device according to claim 1, wherein said forming said barrier metal film includes forming said barrier metal film by an atomic layer deposition (ALD) process.

9. A method for manufacturing a semiconductor device, comprising in order:
   forming a porous film over a semiconductor substrate;
   forming a resist film having a predetermined pattern over said porous film;
   forming a concave portion having a bottom thereof being an exposed surface of said semiconductor substrate by etching said porous film through a mask of said resist film;
   forming a nonporous film containing a methyl group so as to cover an entire interior wall of said concave portion and a surface of said porous film;
   selectively removing a portion of said non-porous film formed on a bottom of said concave portion and a portion of said nonporous film located on said porous film by an anisotropic etch process;
   forming a barrier metal film so as to cover said porous film and the interior wall of said concave portion having said non-porous film on the side wall thereof; and
   forming a metallic film on said barrier metal film to fill said concave portion and then partially removing portions of said barrier metal film and said metallic film that are outside of said concave portion, thereby partially leaving the barrier metal film and the metallic film only in said concave portion,
   wherein, in said selectively removing said nonporous film, the anisotropic etch process is conducted by employing an etching gas having a mixing ratio within a range of equal to or more than 45 and equal to or less than 100, said mixing ratio being represented by a formula: $(N_2+Ar_2/CF_4)$ 10. The method for manufacturing the semiconductor device according to claim 9, wherein, in said forming said nonporous film, the nonporous film is formed under a condition where a temperature is equal to or less than 500 degree C.

* * * * *